(12) United States Patent
Mumtaz

(10) Patent No.: US 9,453,861 B2
(45) Date of Patent: *Sep. 27, 2016

(54) RENEWABLE ENERGY MONITORING SYSTEM

(71) Applicant: SolarCity Corporation, San Mateo, CA (US)

(72) Inventor: Asim Mumtaz, Cambridge (GB)

(73) Assignee: SOLARCITY CORPORATION, San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/147,269

(22) Filed: Jan. 3, 2014

(65) Prior Publication Data

US 2014/0246927 A1    Sep. 4, 2014

Related U.S. Application Data

(63) Continuation of application No. 13/244,222, filed on Sep. 23, 2011, now Pat. No. 8,624,443.

(30) Foreign Application Priority Data

Oct. 25, 2010 (GB) .................................. 1017971.1

(51) Int. Cl.
*H04B 7/155* (2006.01)
*G01R 21/133* (2006.01)
*H04Q 9/00* (2006.01)

(52) U.S. Cl.
CPC ............ *G01R 21/133* (2013.01); *H04B 7/155* (2013.01); *H04Q 9/00* (2013.01); *G08C 2201/40* (2013.01);
(Continued)

(58) Field of Classification Search
CPC ........................... H04B 7/155; H04Q 2209/43

USPC ......................................................... 307/151
See application file for complete search history.

(56) References Cited

U.S. PATENT DOCUMENTS 5,565,855 A    10/1996  Knibbe
8,624,443 B2 *  1/2014  Mumtaz ....................... 307/151
(Continued)

FOREIGN PATENT DOCUMENTS

CN        101674032        3/2010
CN        101877166        11/2010
(Continued)

OTHER PUBLICATIONS

Portions of prosecution history of EP11771270.3, Dec. 12, 2013, Enecsys Limited.
(Continued)

*Primary Examiner* — Fritz M Fleming
(74) *Attorney, Agent, or Firm* — Adeli LLP

(57) ABSTRACT

A solar photovoltaic monitoring system for monitoring and controlling a solar photovoltaic inverter is provided. The system includes a wireless transceiver coupled to a solar photovoltaic inverter that includes a device monitor for monitoring and controlling the inverter. The device monitor generates monitoring data defining a status of the system and transmits the data by using the transceiver coupled to the inverter. The system also includes a wireless repeater for receiving data from the inverter and retransmitting the data and a transceiver coupled to a gateway capable of communicating the received retransmitted data to a monitoring station. The gateway also transmits control data received from the monitoring station. The repeater receives control data from the gateway and retransmits data to the inverter. The inverter receives the retransmitted control data and controls its operation based on the received data.

18 Claims, 3 Drawing Sheets

(52) U.S. Cl.
CPC ....... *G08C 2201/41* (2013.01); *H04Q 2209/43* (2013.01); *H04Q 2209/84* (2013.01); *H04Q 2209/886* (2013.01)

(56) References Cited

U.S. PATENT DOCUMENTS

| | | |
|---|---|---|
| 2002/0080027 A1 | 6/2002 | Conley, III |
| 2002/0149950 A1 | 10/2002 | Takebayashi |
| 2005/0201397 A1 | 9/2005 | Petite |
| 2007/0121648 A1* | 5/2007 | Hahn ........................... 370/401 |
| 2007/0271006 A1* | 11/2007 | Golden et al. ............... 700/295 |
| 2008/0089277 A1* | 4/2008 | Alexander et al. ........... 370/328 |
| 2008/0097655 A1 | 4/2008 | Hadar et al. |
| 2009/0088072 A1* | 4/2009 | Rofougaran et al. ........ 455/13.1 |
| 2009/0160395 A1 | 6/2009 | Chen |
| 2010/0052425 A1 | 3/2010 | Moore et al. |
| 2012/0133208 A1 | 5/2012 | Kalhoff et al. |
| 2012/0154162 A1 | 6/2012 | Vandevelde et al. |
| 2014/0265579 A1 | 9/2014 | Mumtaz |

FOREIGN PATENT DOCUMENTS

| | | |
|---|---|---|
| EP | 1748576 | 1/2007 |
| EP | 1623495 | 10/2009 |
| EP | 2169847 | 3/2010 |
| EP | 2485361 | 8/2012 |
| EP | 2633695 | 9/2013 |
| GB | 2485335 | 9/2012 |
| WO | WO 2005/053189 | 6/2005 |
| WO | WO 2005/119609 | 12/2005 |
| WO | WO 2008/112080 | 9/2008 |
| WO | WO 2012/056212 | 5/2012 |
| WO | WO2014/106745 | 7/2014 |

OTHER PUBLICATIONS

International Search Report and Written Opinion for PCT/GB2014/050005, May 28, 2014 (mailing date), Enecys Limited.

Portions of prosecution history U.S. Appl. No. 13/244,222, Dec. 11, 2013, Enesys Limited.

Portions of prosecution history for GB 1017971.1, Sep. 4, 2012, Enecsys Limited.

International Search Report and Written Opinion for PCT/GB2011/051943, Mar. 1, 2012 (mailing date), Enecsys Limited International Preliminary Report on Patentability for PCT/GB2011/051943, Apr. 30, 2013 (issuance date), Enecsys Limited.

* cited by examiner

RENEWABLE ENERGY MONITORING SYSTEM

CLAIM OF BENEFIT TO PRIOR APPLICATIONS

This application is a continuation application of U.S. patent application Ser. No. 13/244,222, filed Sep. 23, 2011, now issued as U.S. Pat. No. 8,624,443. U.S. patent application Ser. No. 13/244,222 claims priority to an earlier-filed United Kingdom Patent Application 1017971.1, filed Oct. 25, 2010. U.S. patent application Ser. No. 13/244,222, now published as U.S. Publication 2012/0057520 and United Kingdom Patent Application 1017971.1 are incorporated herein by reference.

FIELD OF THE INVENTION

This invention relates to renewable energy monitoring systems, in particular to renewable energy monitoring systems comprising wireless repeaters designed for short range wireless data transmission.

BACKGROUND TO THE INVENTION

Wireless repeaters can be used to increase the range between devices communicating wirelessly. They may be of benefit in situations where a source and receiver are positioned out of wireless range of one another; the wireless repeater acting as an intermediate 'hop' in the transmission path from source to receiver thereby allowing devices to be separated by a greater distance than normally possible.

In some scenarios a single wireless repeater can be insufficient to maintain communication between a wireless source and monitoring station because the distance, even with a wireless repeater, may be too great. In other situations the characteristics of the operating environment may greatly attenuate the wireless data signal and so communication may be further impaired. Metal lined partitions and metallic foil lined insulation in buildings can severely impact wireless transmission for example.

A particular problem exists for communications with renewable energy monitoring systems using solar photovoltaic (PV) power inverters because they are typically located on the roof of a property. The PV power inverter may need to communicate with a gateway, which may be a wireless base station connected to a residential gateway (ADSL or cable modem for example) located, typically, on the ground floor of a building. In such situations wireless transmission is required through a roof and potentially several floors of the property.

One solution is to use multiple repeaters (multi-hop transmission), but this increases the cost and can also be unsightly and inconvenient to the consumer having to install multiple repeaters in the property.

There is therefore a need for an improved wireless repeater avoiding the cost and inconvenience of installing multiple repeaters in a property.

Background prior art can be found in EP2169847 A2, US2005/0201397 A1, US2002/0080027 A1, WO2005/119609 A2, EP1748576 A2, US2009/0160395 A1, CN 101674032 A.

SUMMARY OF THE INVENTION

According to a first aspect of the invention there is provided a renewable energy, in particular solar photovoltaic, monitoring system for monitoring a renewable energy generation device mounted on or adjacent to a building, comprising: a device monitor coupled to a renewable energy generation device to monitor said renewable energy generation device and generate monitoring data defining a status of said renewable energy generation device, said device monitor wirelessly communicating said monitoring data to an gateway using a wireless communications link, said gateway receiving said monitoring data from said device monitor and communicating said monitoring data to a monitoring station; and a wireless repeater providing said communications link between said device monitor and said gateway, wherein said wireless repeater comprises: a wireless transceiver module; a plurality of spaced apart antennas coupled to said wireless transceiver module; at least one antenna interface having one or more of said plurality of spaced apart antennas electrically coupled thereto; wherein said wireless transceiver module is coupled to said at least one antenna interface, said wireless transceiver module comprising data receiving and transmission means to receive said monitoring data from at least one of said plurality of spaced apart antennas and to transmit said monitoring data using one or more other of said plurality of spaced apart antennas, and a processing element coupled to said data receiving and transmission means to process said monitoring data received and transmitted from said one or more of said plurality of antennas.

Antennas are spaced apart, at least one located within communication range of each device transmit or receive data (or both transmit and receive), such as the device monitor and gateway. Data transmitted by either device is received by an antenna then retransmitted using one or more other antennas (which may also include the same antenna received the data that is then retransmitted. The same renewable energy monitoring system can be used for both residential properties and commercial establishments without needing to change this hardware by repositioning each antenna accordingly. The renewable energy generation device may be located on the roof of the building for example, in particular if the device is a solar PV system incorporating a solar PV cell and solar PV inverter. The device monitor may be coupled to, or integrated within, the solar PV inverter (or other renewable energy generation device). Where only monitoring is required, communication may only need to be unidirectional from the device monitor to a monitoring station (although it will be appreciated that communication may also be bidirectional and provide control data, or requests for monitoring data to the renewable energy generation device). The monitoring station may be local, within the building for example, or alternatively may also be remote. A remote monitoring station may be located at the utility provider (the provider of the renewable energy generation device) who may monitor multiple systems in parallel for each residential/commercial building (to monitor the status and functionality of the energy generation devices). Alternatively or additionally, the monitoring may further be record energy generation data to credit a user's account with electricity fed into an electrical grid.

In embodiments said gateway receives control data from said monitoring station and communicates said control data to said device monitor using said wireless communications link; said wireless transceiver module receives said control data from at least one of said plurality of spaced apart antennas and transmits said control data using one or more other of said plurality of spaced apart antennas; and said device monitor receives said control data from said gateway and controls said renewable energy generation device dependent on said control data.

Control information may be sent from the monitoring station to the energy generation device, including for example activation and deactivation information, positioning data, and update control firmware for example.

In embodiments a said wireless transceiver module is coupled to one of the antenna interfaces; the antenna interface being electrically coupled to two or more of said plurality of antennas, said coupling comprising a transmission line splitter, wherein: said transmission line splitter transmits monitoring data received from at least one of said two or more of said plurality of antennas to said antenna interface, and said transmission line splitter transmits monitoring data received from said antenna interface to each of said two or more of said plurality of antennas.

In further embodiments said transmission line splitter transmits control data received from at least one of said two or more of said plurality of antennas to said first antenna interface, and said transmission line splitter transmits control data received from said first antenna interface to each of said two or more of said plurality of antennas.

Multiple antennas are coupled to a single antenna interface on the wireless repeater using a transmission line splitter. This advantageously changes the transmission and reception regions, each region being such each of the devices can be communicated with by an antenna. Transmission power of the wireless repeater does not necessarily need to be increased as a result of power dividing the signal between the multiple antennas using the transmission line splitter because each antenna can be positioned within range of each device being communication with.

In embodiments the transmission line splitter is impedance matched to transmission lines electrically coupling said two or more of said plurality of antennas to said transmission line splitter. In embodiments said transmission lines comprise coaxial cable. Impedance matching provides for maximum power transfer, helps to minimise losses in the transmission lines and minimises signal reflections.

The regions of transmission and reception associated with each of said plurality of spaced apart antennas may be non-overlapping. In embodiments said renewable energy monitoring system is located on or within a building, said building comprising at least two separate regions separated by a partition, wherein: a first of said plurality of spaced apart antennas is located in a first of said at least two separate regions of said building and a second of said plurality of spaced apart antennas is located in a second of said at least two separate regions of said building; and said regions of transmission and reception associated with each of said first and second of said plurality of spaced apart antennas are non-overlapping, said partition limiting said transmission and reception.

In embodiments of the renewable energy monitoring system a first of said plurality of spaced apart antennas is located proximally to said device monitor and a second of said plurality of spaced apart antennas is located proximally to said gateway.

Advantageously this minimises power requirements for the wireless transceivers as only a short transmission range is required, perhaps in the order of several to tens of meters.

In embodiments said renewable energy generation device comprises a photovoltaic inverter. The gateway provides a link to a remote monitoring station (at a solar PV energy company or manufacturer for example) which may monitors and controls the operation of the solar PV inverter. The gateway may be a wireless base station connected to a communications gateway such as an ADSL modem, cable router or network interface installed within the property. Alternatively the gateway may communicate or be integrated into a local monitoring station within the property, providing direct monitoring and control of the solar PV inverter.

In embodiments of the renewable energy monitoring system said device monitor and said gateway and said wireless transceiver module comprise comprises a Zigbee™ transceiver module providing low rate data transmission and long battery life (compared to higher performance higher power wireless technologies such as Wi-Fi).

According to a second aspect of the invention there is provided a method of monitoring a renewable energy generation, in particular solar photovoltaic, device mounted on or adjacent to a building, the method comprising: generating monitoring data at a renewable energy generation device, said monitoring data defining a status of said renewable energy generation device; wirelessly communicating said monitoring data to an gateway using a wireless communications link, said gateway communicating said monitoring data to a monitoring station; using a wireless repeater to provide said wireless communications link, the wireless repeater comprising: a plurality of spaced apart antennas each having an associated region of transmission and reception, and at least one antenna interface having one or more of said plurality of spaced apart antennas electrically coupled thereto; the method further comprising using a wireless transceiver module to receive monitoring data from at least one of said plurality of spaced apart antennas using data receiving means, processing said received monitoring data, and transmitting said processed and received monitoring data using said data transmission means to one or more other of said plurality of spaced apart antennas.

Antennas are spaced apart, each located within communication range of one of the devices to communicate with. Data transmitted by each device is received by each antenna then retransmitted using one or more other antennas. The same renewable energy monitoring system can be used for both residential properties and commercial establishments without needing to change this hardware by repositioning each antenna accordingly.

In embodiments the method further comprises: said gateway receiving control data from said monitoring station; communicating said control data to said renewable energy generation device using said wireless communications link; said wireless transceiver modules receiving control data from at least one of said plurality of spaced apart antennas using said data receiving means, processing said received control data, and transmitting said processed and received control data using said data transmission means to one or more other of said plurality of spaced apart antennas; and the method further comprising: receiving said control data at said renewable energy generation device and controlling said renewable energy generation device dependent on said control data;

Control information may be sent from the monitoring station to the energy generation device, including for example activation and deactivation information, positioning data, and update control firmware for example.

In embodiments the method further comprises: coupling a said wireless transceiver module to said at least one antenna interface; electrically coupling two or more of said plurality of antennas to said at least one antenna interface using a transmission line splitter; receiving monitoring data from at least one of said two or more of said plurality of antennas and transmitting said received monitoring data to said at least one antenna interface via said transmission line splitter; and transmitting said monitoring data received from said at least one antenna interface to each of said two or more of said plurality of antennas using said transmission line splitter.

In embodiments the method further comprises: receiving control data from at least one of said two or more of said plurality of antennas and transmitting said received control data to said first at least one antenna interface using said transmission line splitter; and transmitting said control data received from said first of said at least one antenna interface to each of said two or more of said plurality of antennas via said transmission line splitter.

In the method multiple antennas may be coupled to a single antenna interface on the wireless repeater using a transmission line splitter thereby advantageously changing the transmission and reception regions, each region being such that at least one of the devices can be communicated with. Transmission power of the wireless repeater does not necessarily need to be increased as a result of power dividing the signal between the multiple antennas using the transmission line splitter because each antenna can be positioned within range of each device being communication with.

In embodiments the method further comprises impedance matching said transmission line splitter to transmission lines electrically coupling said two or more of said plurality of antennas to said transmission line splitter. In embodiments said transmission lines comprise coaxial cable. Impedance matching provides for maximum power transfer, helps to minimise losses in the transmission lines and minimises signal reflections.

In embodiments of the method said renewable energy monitoring system is located on or within a building, said building comprising at least two separate regions separated by a partition, wherein: a first of said plurality of spaced apart antennas is located in a first of said at least two separate regions of said building and a second of said plurality of spaced apart antennas is located in a second of said at least two separate regions of said building; and said regions of transmission and reception associated with each of said first and second of said plurality of spaced apart antennas are non-overlapping, said partition limiting said transmission and reception.

Advantageously this minimises power requirements for the wireless transceivers as only a short transmission range is required, perhaps in the order of several to tens of meters. The wireless transceiver module used in the method may comprise a Zigbee™ transceiver module for example.

According to another aspect of the invention there is provided a wireless repeater comprising: a wireless transceiver module; a plurality of spaced apart antennas coupled to said wireless transceiver module; at least one antenna interface having one or more of said plurality of spaced apart antennas electrically coupled thereto; wherein said wireless transceiver module is coupled to said at least one antenna interface, said wireless transceiver module comprising data receiving and transmission means to receive data from at least one of said plurality of spaced apart antennas and to transmit said data using one or more other of said plurality of spaced apart antennas, and a processing element coupled to said data receiving and transmission means to process said data received and transmitted from said one or more of said plurality of antennas.

Antennas are spaced apart, each located within communication range of one of the devices needing to transmit or receive data (or both transmit and receive). Data transmitted by a device is received by an antenna then retransmitted using one or more other antennas. The same PV inverter and transceiver systems can be used for both residential properties and commercial establishments without needing to change of this hardware.

In embodiments of the wireless repeater a said wireless transceiver module is coupled to a first of said at least one antenna interface; said antenna interface being electrically coupled to two or more of said plurality of antennas, said coupling comprising a transmission line splitter, wherein: said transmission line splitter transmits data received from said two or more of said plurality of antennas to said antenna interface, and said transmission line splitter transmits data received from said antenna interface to each of said two or more of said plurality of antennas.

According to yet another aspect of the invention there is provided a solar photovoltaic monitoring system for monitoring and controlling a solar photovoltaic inverter, comprising: a wireless transceiver coupled to a solar photovoltaic inverter, said solar photovoltaic inverter comprising a device monitor monitoring and controlling said solar photovoltaic inverter, said monitoring comprising generating monitoring data defining a status of said solar photovoltaic system and transmitting said monitoring data using said wireless transceiver coupled to said solar photovoltaic inverter; a wireless repeater, in particular as described above, said wireless repeater receiving said monitoring data from said solar photovoltaic inverter and retransmitting said monitoring data; a wireless transceiver coupled to an gateway, said gateway communicating said retransmitted monitoring data received using said wireless transceiver coupled to said gateway to a monitoring station, said gateway transmitting control data received from said monitoring station using said wireless transceiver coupled to said gateway; wherein said wireless repeater further receives said control data from said gateway and retransmits said control data to said solar photovoltaic inverter; and wherein said controlling in said solar photovoltaic inverter comprises receiving said retransmitted control data from said wireless transceiver coupled to said solar photovoltaic inverter and controlling said solar photovoltaic inverter dependent on said control data.

The solar photovoltaic monitoring system monitors and controls the solar PV inverter, communicating status information from the solar PV inverter, to the wireless repeater, the wireless repeater then retransmitting the status information to a gateway. The gateway provides a link to a remote monitoring station (at a solar PV energy company or manufacturer for example) which may monitors and controls the operation of the solar PV inverter. The gateway may be a wireless base station connected to a communications gateway such as an ADSL modem, cable router or network interface installed within the property. Alternatively the gateway may communicate or be integrated into a local monitoring station within the property, providing direct monitoring and control of the solar PV inverter. Control information from the monitoring station is sent to the gateway which then transmits the control data. The control data is received by the wireless repeater and then retransmitted to a controller in the solar PV inverter, thereby controlling operation of the solar PV system.

BRIEF DESCRIPTION OF THE DRAWINGS

These and other aspects of the invention will be further described, by way of example only, with reference to the accompanying figures in which.

DETAILED DESCRIPTION OF THE DRAWINGS

Figure 1:
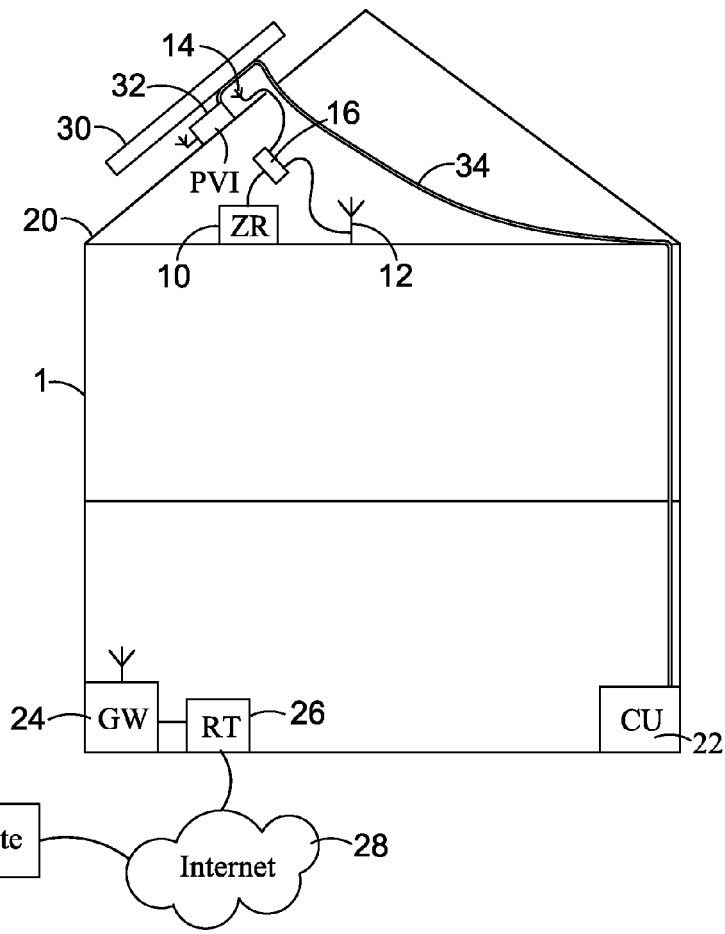
FIG. 1 shows an example renewable energy monitoring system in a residential property according to an embodiment of the present invention.

FIG. 1 shows a residential property 1 fitted with a solar PV panel 30 located on roof 20 fitted with a first embodiment of the invention. A PV power inverter 32 is mounted on the roof 20 located under the solar PV panel 30.

The PV inverter 32 receives a DC voltage generated by the solar PV panel 30 and converts it into AC electricity. The generated AC electricity (typically 230V AC or 110V AC depending on country or mains electricity supply for the building) is then fed into the consumer unit 22 by electricity cable 34.

A wireless transceiver in a device monitor located on the PV inverter transmits status (monitoring) information and receives control data. This eliminates the need for repeated access to the roof of the property to configure and control the operation of the PV inverter and solar cells. In the embodiment shown in FIG. 1 the PV inverter uses a Zigbee™ wireless transceiver designed for short range communication, typically over communication distances needed within residential properties. It will however be appreciated that other forms of wireless communication may be used such as Wi-Fi™ and Bluetooth™ for example. Zigbee is particularly beneficial to use due to its low power capabilities compared to technology such as Wi-Fi and ability to support products requiring a long battery life.

A gateway 24 (wireless base station) communicates with the PV inverter providing an interface to the residential network or broadband internet modem/router 26. This allows remote access and monitoring of PV inverter and solar cells by the PV inverter provider or electricity supplier at monitoring site 34. As this needs to be connected to, typically, a consumer's broadband internet modem/router 26 the positioning of the gateway 24 may be restricted to certain locations in the property.

The distance between the wireless base station and PV inverter may be too great to permit direct communication, thereby requiring the use of a wireless repeater to extend the range. This may still be insufficient to communicate through the roof 20 of the property 1 due to the construction materials used in the roof such as high performance insulation materials (in particular those using a conductive foil lining), resulting in significant attenuation of the wireless signal.

To eliminate the need for multiple wireless repeaters between the PV inverter and wireless base station the repeater 10 (shown in further detail in FIG. 4), is located in the roof space of property 1. The antenna output is connected to a transmission line splitter 16 which in turn is connected to a pair of antennas 12 and 14 using coaxial cable. One of these antennas, antenna 14, is mounted on the roof of the property in close proximity to the PV inverter and the second antenna 12 in the roof space of the property. It will be appreciated that second antenna 12 may alternatively be mounted closer to the wireless base station if needed to stay within communication range. The electricity feed from the PV inverter 32 to the consumer unit 22 typically requires a connection through the roof of the property for the electricity cable through and so provides an existing route for the coaxial cable connecting the splitter 16 to the roof mounted antenna 14.

Figure 4:
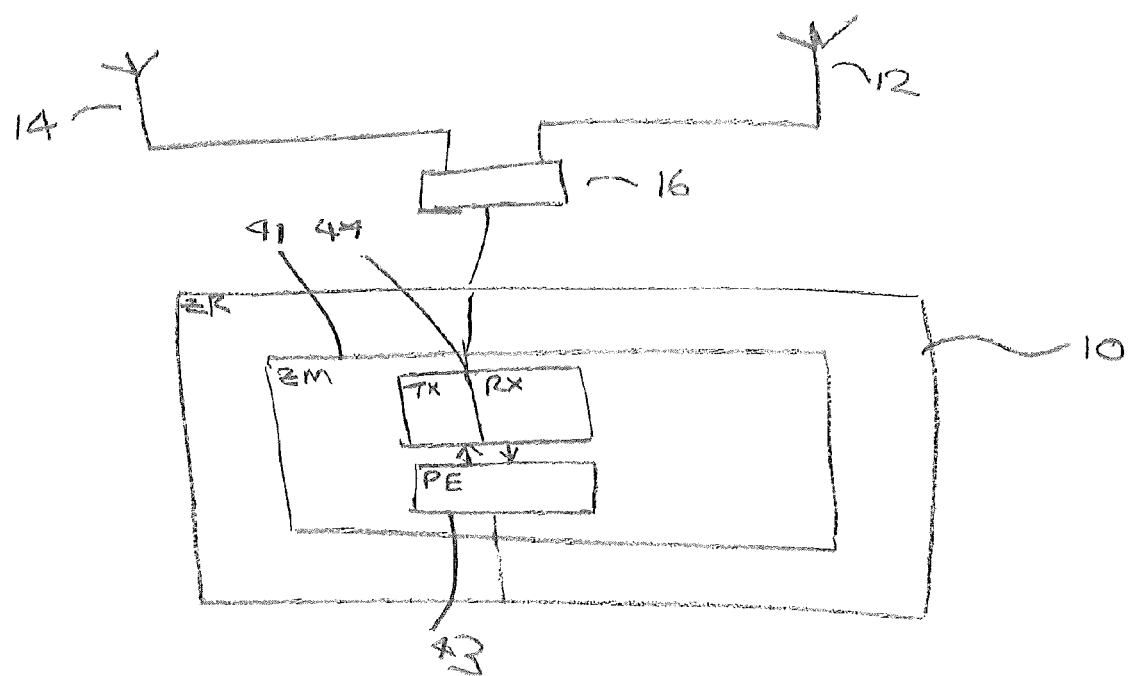
FIG. 4 shows a detailed view of the wireless repeater used in the renewable energy monitoring system shown in FIG. 1.

The embodiment of the wireless repeater used in FIG. 1 is shown in further detail in FIG. 4. The transceiver module 10 comprises a radio module 47 providing transmit and receive radio (transmission and receiver means) and a processing element 43. The radio module 47 receives data from either antenna 14, located proximally to the PV inverter in FIG. 1, extracts and then transmits the digital data to processing element 43. The processing element 43 processes data received and decoded by the radio module 46, performing data control, routing and interfacing operations for example. It will be appreciated however that processing may simply require forwarding data back to the radio module 47. The processed data is then transmitted by the transmitting portion of radio module 47 to antennas 12 and 14 via transmission line splitter 16.

Splitter 16 divides the transmit power being each antenna. Consequently, if the transceiver module has a fixed power output the transmission range of each antenna is reduced compared to use of a single transmit antenna. The antennas are now however located closer to the communicating devices 32, 24 and so communication can be maintained even though the transmit range, per antenna, has been reduced.

Figure 3:
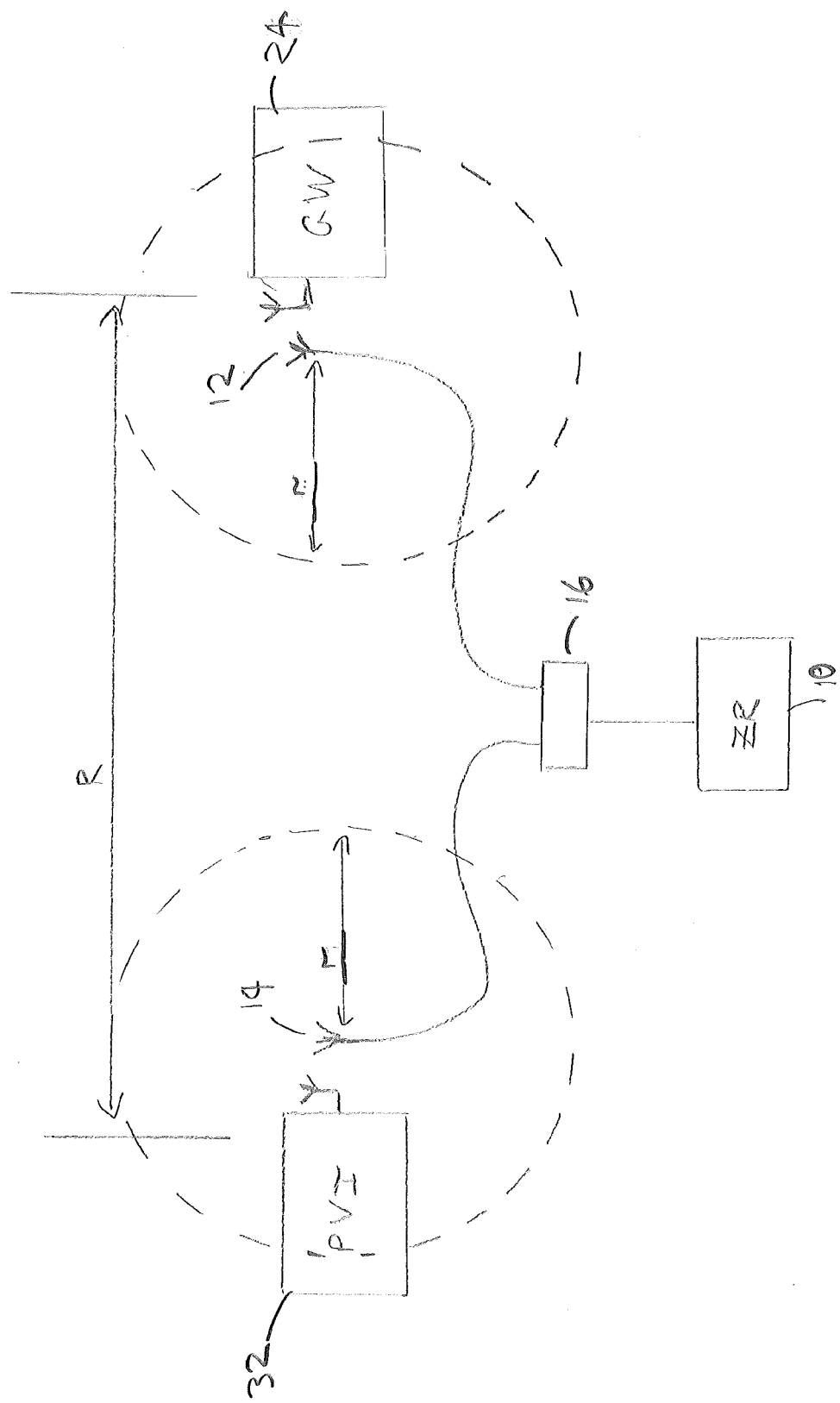
FIG. 3 shows how the distance between devices can be extended according to the embodiment in FIG. 1.

If multiple PV inverters are distributed across the roof out of range of the installed antenna 14 additional antennas may be installed and connected to the splitter 16. Again, it will be appreciated that the transmit power per antenna will be further reduced reducing the transmit range of each antenna. FIG. 3 shows how the separation of source and receiver devices can be extended according to the embodiment shown in FIG. 1. The PV inverter 32 and gateway 24 are separated by a distance R, where R exceeds the communication range of the wireless transceivers in PV inverter 32 and reception capabilities of gateway 24. Antennas 14 and 12 are located proximally to the PV inverter 32 and gateway 24 respectively within a communication range r. Communication between the wireless transceivers, with the use a single wireless repeater 10 is then achieved.

Figure 2:
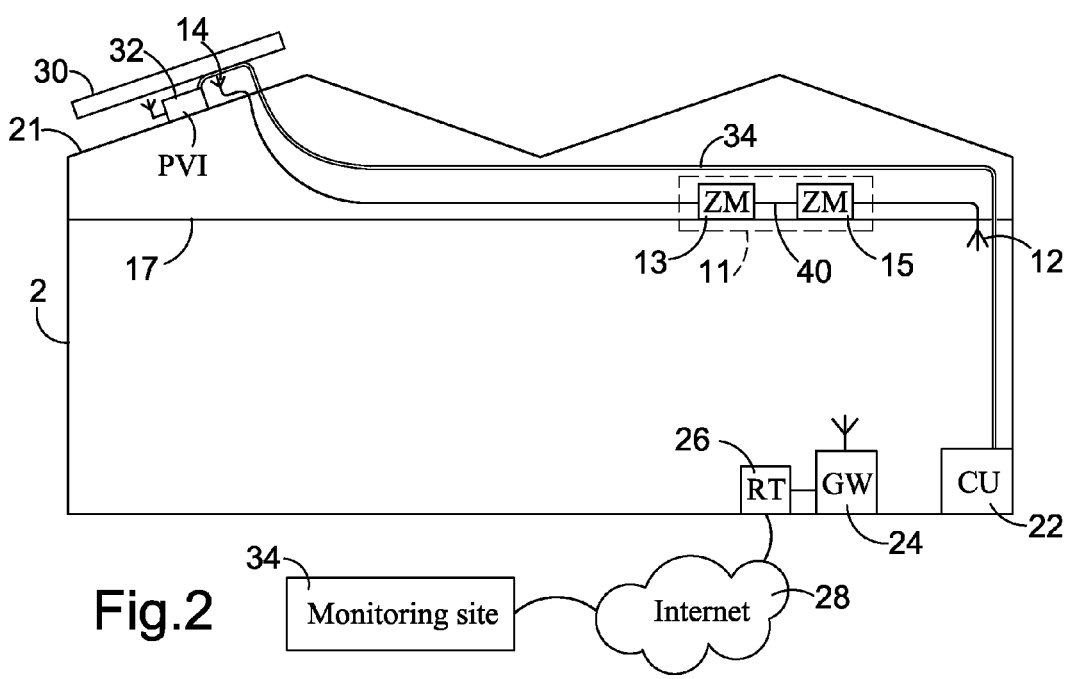
FIG. 2 shows an example renewable energy monitoring system in a commercial property according to an embodiment of the present invention.

FIG. 2 shows a second embodiment of the invention implemented in a commercial property 2 fitted with a solar PV panel 30. A PV power inverter 32, identical to PV power inverter shown in FIG. 1 is mounted on the roof 21 located under the solar PV panel 32. In FIG. 2 the roof 21 is manufactured from corrugated metal sheets, (aluminium for example), resulting in a higher signal attenuation compared to residential property 1 in FIG. 1. The size of the building further increases the distance between the PV inverter 32 and the gateway 24 (wireless base station for example).

In the embodiment in FIG. 2 the wireless repeater 11 is implemented from a pair of transceiver modules 13, 15, although it will be appreciated that only one may be necessary and the embodiment as described with reference to FIG. 1 may also be used. One of these antennas, antenna 14, is mounted on the roof of the property in close proximity to the PV inverter and the second antenna 12 in the roof space of the commercial property. The increased size of the property compared to that in FIG. 1 requires higher transmit power to reach the gateway 24 and so dividing the power between multiple antenna may be insufficient. To address this, in FIG. 2, the wireless repeater 11 comprises a pair of transceiver systems 13, 15 interconnected by a wired communication link. Each transceiver system is connected to an antenna 12, 14 by coaxial cable with the connection to the roof antenna 14 routed similarly to that done in FIG. 1. The second antenna, antenna 12 is routed through the ceiling 17 of building 2 to minimise the obstructions to gateway 24.

The transceiver modules 13,15 each comprise a radio module 46,48 providing transmit and radio module 46 receives data from antenna 14, extracts and then transmits the digital data to processing element 42. The processing element 42 processes data received and decoded by the radio module 46, performing data control, routing and interfacing operations for example. It will be appreciated however that processing may simply require forwarding the received data through to the wire link 40 to the processing element 44 in transceiver module 15. The communicated data is then transmitted by the transmitting portion of transceiver 48 to antenna 12.

The wired communication link 40 in FIG. 2 is implemented using a serial link and serial wire protocol—an interface and standard commonly found on wireless transceiver modules such as those implementing the Zigbee standard. It will be appreciated however that many difference wired interfaces and standards are available and any such standard may be adopted. Preferably, however the interface standard adopted will be low power so that the receiver can run off a battery.

Each antenna output in FIG. 2 may be further split as shown in FIG. 1 to change the transmission and reception regions, at a cost of reduced range per antenna.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A solar photovoltaic ("PV") monitoring system comprising:
    a plurality of solar PV inverters for converting solar power to ac mains power, each solar PV inverter comprising:
        a device monitor for generating monitoring data of said solar PV inverter; and
        a wireless transceiver for (1) transmitting said monitoring data and (2) receiving control data for controlling the solar PV inverter;
    a gateway comprising a wireless transceiver for receiving said monitoring data and for transmitting said control data; and
    a wireless repeater for wirelessly relaying said monitoring data from the plurality of solar PV inverters to the gateway and for wirelessly relaying said control data from the gateway to the plurality of solar PV inverters, the wireless repeater comprising:
        a plurality of antennas, wherein each antenna of said plurality of antennas is positioned to wirelessly exchange data with a subset of solar PV inverters through the first wireless transceivers of the subset of solar PV inverters; and
        an additional antenna that is positioned to wirelessly exchange data with the gateway through the second wireless transceiver of the gateway.

2. The solar PV monitoring system of claim 1, wherein the wireless repeater further comprises:
    a wireless transceiver module coupled to the plurality of antennas and the additional antenna, the wireless transceiver module comprising data receiving and transmission means to receive data from said plurality of antennas and to transmit said data using the additional antenna and a processing element coupled to said data receiving and transmission means to process said data received and transmitted from said plurality of antennas.

3. The solar PV monitoring system of claim 2 further comprising a passive radio frequency splitter coupled between said plurality of antennas and said wireless transceiver module.

4. The solar PV monitoring system of claim 1, wherein the plurality of antennas are spaced apart by at least 0.5 m, wherein regions of transmission and reception associated with each antenna of said plurality of spaced apart antennas are non-overlapping.

5. The solar PV monitoring system of claim 4, wherein the additional antenna is adjacent to said wireless transceiver module.

6. A system for monitoring a plurality of solar photovoltaic ("PV") renewable energy generation devices mounted on or adjacent to a building, the system comprising:
    for each of the plurality of solar PV renewable energy generation devices, a device monitor for:
        generating monitoring data defining a status of said solar PV renewable energy generation device; and
        said device monitor wirelessly communicating said monitoring data using a wireless communications link;
    a gateway for receiving said monitoring data from said device monitor and communicating said monitoring data to a monitoring station; and
    a wireless repeater providing said communications link between said device monitor and said gateway, said wireless repeater comprising:
        a plurality of antennas, wherein each antenna of the plurality of antennas is positioned to wirelessly exchange data with a subset of said solar PV renewable energy generation devices' device monitors;
        an additional antenna that is positioned to wirelessly exchange data with the gateway; and
        a wireless transceiver module coupled to each antenna of the wireless repeater, the wireless transceiver module comprising:
            data receiving and transmission means to receive said monitoring data from said plurality of antennas and to transmit said received monitoring data using the additional antenna; and
            a processing element coupled to said data receiving and transmission means to process said received monitoring.

7. The system of claim 6, wherein said gateway receives control data from said monitoring station and communicates said control data to said device monitor using said wireless communications link,
    wherein said wireless transceiver module of the wireless repeater receives said control data from the additional antenna and transmits said control data using the first plurality of antennas, and
    wherein said device monitor receives said control data and controls said solar PV renewable energy generation device dependent on said control data.

8. The system of claim 7, wherein said wireless transceiver module is coupled to each antenna through a transmission line splitter that is for transmitting monitoring data received from said plurality of antennas to said wireless transceiver module and transmitting control data received from said wireless transceiver module to each antenna of the plurality of antennas.

9. The system of claim 8, wherein said transmission line slitter is further for transmitting monitoring data received from said wireless transceiver module to the additional antenna and transmitting control data received from the additional antenna to the wireless transceiver module.

10. The system of claim 8, said transmission line splitter being impedance matched to transmission lines electrically coupling each antenna of the wireless repeater to said transmission line splitter.

11. The system of claim 10, wherein each transmission line comprises a coaxial cable.

12. The system of claim 6, wherein said building comprises at least two separate regions separated by a partition, wherein:
   a first antenna of said plurality of antennas is located in a first of said at least two separate regions of said building and a second antenna of said plurality of antennas is located in a second of said at least two separate regions of said building, and
   said at least two separate regions are non-overlapping and said partition limits wireless exchange of data.

13. The system of claim 6, wherein a said first of plurality of antennas is located proximally to a particular subset of solar PV renewable energy generation devices and the additional antenna is located proximally to said gateway.

14. A method of monitoring a plurality solar photovoltaic ("PV") renewable energy generation devices mounted on or adjacent to a building, the method comprising:
   for each of the plurality of solar PV renewable energy generation devices, generating monitoring data defining a status of said solar PV renewable energy generation device;
   wirelessly communicating said monitoring data to a gateway using a wireless communications link, said gateway for communicating said monitoring data to a monitoring station;
   using a wireless repeater to provide said wireless communications link, the wireless repeater comprising:
      a plurality of spaced apart antennas each having an associated region of transmission and reception for a subset of solar PV renewable energy generation devices;
      an additional antenna having an associated re ion of transmission and reception for the gateway; and
      a wireless transceiver module for receiving the monitoring data from the plurality of spaced apart antennas and transmitting the monitoring data through the additional antenna.

15. The method of claim 14 further comprising:
   coupling said wireless transceiver module to each antenna interface using a transmission line splitter;
   receiving monitoring data from said plurality of antennas and transmitting said received monitoring data to the wireless transceiver module using said transmission line splitter; and
   transmitting said control data received from said wireless transceiver module to each antenna of the plurality of antennas via said transmission line splitter.

16. The method of claim 15 further comprising:
   transmitting monitoring data received from said wireless transceiver module to the additional antenna via said transmission line splitter; and
   receiving said control data from said additional antenna via said transmission line splitter.

17. The method of claim 15 further comprising:
   impedance matching said transmission line splitter to transmission lines electrically coupling each antenna to said transmission line splitter.

18. The method of claim 14, wherein said building comprising at least two separate regions separated by a partition, the method further comprising:
   locating a first antenna of said plurality of spaced apart antennas in a first of said at least two separate regions of said building and a second antenna of said plurality of spaced apart antennas in a second of said at least two separate regions of said building; and
   arranging said regions such that they are substantially non-overlapping, said partition limiting said transmission and reception of data.

* * * * *